US009879339B2

(12) United States Patent
Chiang

(10) Patent No.: US 9,879,339 B2
(45) Date of Patent: Jan. 30, 2018

(54) NICKEL-CHROMIUM-SILICON BASED COATINGS

(71) Applicant: Southwest Research Institute, San Antonio, TX (US)

(72) Inventor: Kuang-Tsan Kenneth Chiang, Helotes, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 985 days.

(21) Appl. No.: 13/847,953

(22) Filed: Mar. 20, 2013

(65) Prior Publication Data

US 2016/0032447 A1 Feb. 4, 2016

Related U.S. Application Data

(60) Provisional application No. 61/613,340, filed on Mar. 20, 2012.

(51) Int. Cl.

| | |
|---|---|
| ***C23C 14/00*** | (2006.01) |
| ***C23C 14/32*** | (2006.01) |
| ***C23C 14/35*** | (2006.01) |
| ***C23C 14/34*** | (2006.01) |
| ***C23C 14/16*** | (2006.01) |
| ***C23C 28/00*** | (2006.01) |

(52) U.S. Cl.

CPC .......... *C23C 14/352* (2013.01); *C23C 14/165* (2013.01); *C23C 14/345* (2013.01); *C23C 14/3485* (2013.01); *C23C 28/321* (2013.01); *C23C 28/34* (2013.01)

(58) Field of Classification Search

CPC . C23C 14/165; C23C 14/345; C23C 14/3485; C23C 14/352

See application file for complete search history.

(56) References Cited

U.S. PATENT DOCUMENTS

| | | | | |
|---|---|---|---|---|
| 4,298,505 | A * | 11/1981 | Dorfeld | C22C 19/05 252/512 |
| 6,224,725 | B1 * | 5/2001 | Glocker | C23C 14/355 204/192.12 |
| 2001/0019781 | A1 * | 9/2001 | Hasz | C23C 4/02 428/633 |
| 2004/0026367 | A1 * | 2/2004 | Goebel | G01L 9/0054 216/59 |
| 2013/0122317 | A1 * | 5/2013 | Cheruvu | B32B 33/00 428/472 |

OTHER PUBLICATIONS

Amjad, et al, "An Evaluation of Silica Scale Control Additives for Industrial Water Systems"; Paper No. 08368, NACE International Corrosion 2008 Conference & Expo., 12 pgs.

(Continued)

*Primary Examiner* — Ibrahime A Abraham

(74) *Attorney, Agent, or Firm* — Tucker Grossman

(57) ABSTRACT

A method of depositing Ni—Cr and Si coatings onto a turbine component comprising supplying a Ni—Cr target and Si target with a dual-gun magnetron sputtering system; introducing inert gas and negatively biasing the magnet assembly; grounding or negatively biasing the turbine component to be coated; rotating the turbine component, wherein the turbine component has a surface; and forming a Ni—Cr and Si coating on the component surface.

16 Claims, 6 Drawing Sheets

500

504

502

506

(56) References Cited

OTHER PUBLICATIONS

Birks, et al, "Introduction to the High-Temperature Oxidation of Metals"; Cambridge University Press, New York City, NY; 2nd Edition 2006; Chapter 8 "Hot Corrosion"; pp. 205-252.
Cheruvu, et al, "Microstructure and Oxidation Resistance of Non-crystalline 304 SS-AL Coatings"; Surface & Coatings Technology, vol. 204, 2009; pp. 751-755.
Chiang, et al, "Development of Diamond-like Carbon-coated Electrodes for Corrosion Sensor Applications at High Temperatures"; Science Direct, Thin Solid Films vol. 517, 2008; pp. 1120-1124.
Chiang, et al, "Dynamic Oxidation of a Cu-30vol.%Cr Coating on a Copper-based Alloy"; Surface and Coatings Technology, vol. 86-87,1996, pp. 48-53.
Chiang, et al, "Growth Morphology and Corrosion Resistance of Magnetron Sputtered Cr Films"; Surface and Coatings Technology, vol. 206, 2011, pp. 1660-1665.
Chiang, et al., "Low Temperature Hot Corrosion"; National Assoc. of Corrosion Engineers, Mar. 2-6, 1981, San Diego, CA; Library of Congress, Catalog No. 82-62829, pp. 519-530.
Gabb, et al, "The Effects of Hot Corrosion Pits on the Fatigue Resistance of a Disk Superalloy"; Journal of Materials Engineering and Performance. vol. 19(1), Feb. 2010, pp. 77-89.
Grunling, et al, "The Role of Silicon in Corrosion-resistant High Temperature Coatings"; Metallurgical and Protective Coatings, Thin Solid Films, vol. 95, 1982 pp. 3-20.
Gupta, "The Cr-Ni-Si (Chronium-Nickel-Silicon) System"; Journal of Phase Equilibria and Diffusion, vol. 27, No. 5, 2006, pp. 523-528.
Lindfors, et al, "Cathodic Arc Deposition Technology"; Surface and Coatings Technology, vol. 29, 1986, pp. 275-290.
Lin, et al, "Modulated Pulse Power Sputtered Chromium Coatings"; Science Direct, Thin Solid Films, vol. 518, 2009, pp. 1566-1570.
Lin, et a; "Recent Advances in Modulated Pulsed Power Magnetron Sputtering for Surface Engineering"; Journal of Metals, vol. 63, No. 6, Jun. 2011, pp. 48-58.
Lin, et al, "The Structure and Properties of Chromium Nitride Coatings Deposited Using DC, Pulsed DC and Modulated Pulse Power Magnetron Sputtering"; Surface and Coatings Technology, vol. 204, 2010, pp. 2230-2239.
Luthra, "Mechanism of Low Temperature Hot Corrosion"; National Assoc. of Corrosion Engineers, Mar. 2-6, 1981, San Diego, CA; Library of Congress, Catalog No. 82-62829, pp. 507-512.
Mattox, Table of Contents for "Handbook of Physical Vapor Deposition (PVD) Processing" ; Noyes Publication, New Jersey, 1998., pp. viii-xxvii.
Pettit, "Hot Corrosion of Metals and Alloys"; Oxidation of Metals, vol. 76, 2011, pp. 1-21.
Rapp, "Hot Corrosion of Materials: a Fluxing Mechanism?"; Corrosion Science, vol. 44, 2002, pp. 209-221.
Thornton; "Coating Deposition by Sputtering"; Deposition Technologies for Films and Coatings, Developments and Applications, Noyes Publications,New Jersey, 1982, Chapter 5, pp. 170-243.
Wallace, et al; "Dynamic Oxidation Performance of NARloy-Z with Cu-30 Volume Percent Cr Coating"; Journal of Spacecraft and Rockets, vol. 35, No. 4, Jul.-Aug. 1998, pp. 546-551.
Wei, "Plasma Enhanced Magnetron Sputtering Deposition of Superhard, Nanocomposite Coatings"; Plasma Surface Engineering Research and its Practical Applications, Research Signpost, Kerala, India, 2008, pp. 87-111.
Wen, et al, "Low-temperature Hot Corrosion in the Refining Industry"; NACE International Corrosion 2011, Conference & Expo, Paper No. 11365, pp. 1-14.

* cited by examiner

NICKEL-CHROMIUM-SILICON BASED COATINGS

CROSS-REFERENCE TO RELATED APPLICATIONS

The present application claims the benefit of the filing date of U.S. Provisional Application No. 61/613,340, filed on Mar. 20, 2012, the teachings of which are incorporated by reference herein.

FIELD OF THE INVENTION

The present disclosure is directed at nickel-chromium-silicon based coatings that may be applied on substrates such as gas turbine components. This may then provide protection against relatively high temperature oxidation and/or hot corrosion, such as corrosion that occurs at temperatures in the range of 600° C. to 1000° C. The coatings herein may be advantageously applied by a magnetron sputtering process, such as a dual-gun and relatively high power pulse magnetron sputtering procedure.

BACKGROUND

Hot corrosion is an accelerated and often catastrophic surface attack of superalloy gas turbine components often occurring in the temperature range of 600° C. to 1000° C. A superalloy herein is reference to an alloy that typically has a matrix with an austenitic face-centered cubic structure, and whose base alloying elements are nickel, cobalt, nickel-cobalt or nickel-iron. Applications of superalloys which are susceptible to hot corrosion are in the aerospace, industrial gas turbine and marine turbine industries. The above type of accelerated attack is considered to be due primarily to deposits of sodium sulfate ($Na_2SO_4$) which when operating at temperatures higher than its melting temperature of 884° C., act as a flux to damage an otherwise protective oxide scale. The $Na_2SO_4$ can be ingested in the gas turbine intake air or can be produced by a reaction between sodium chloride (NaCl) in the air and sulfur (S) as an impurity in the fuel. The corrosive effect may be further intensified in marine and other industrial turbines where the alloys may be contaminated with other impurities as well as $Na_2SO_4$.

The subject of hot corrosion may be divided into two sub-types: Type I—high-temperature hot corrosion above about 900° C. where pure $Na_2SO_4$ is above its melting temperature (884° C.), and Type II—low-temperature hot corrosion (LTHC) between about 600 to 750° C. where a low melting eutectic such as $Na_2SO_4$—$CoSO_4$ (melting point 565° C.) is formed on the metal surface. The Type I hot corrosion is characterized by accelerated oxidation and sulfide formation in the alloy matrix. Type II hot corrosion is characterized by pitting corrosion. Prolonged exposure of gas turbine superalloys to low-melting eutectic salts can therefore seriously degrade the durability of the turbine components.

Most conventional protective coatings are based on either alumina ($Al_2O_3$) formation or chromia ($Cr_2O_3$) formation for high-temperature oxidation and corrosion protection. Theoretical consideration and laboratory tests indicated that both the alumina-forming and chromia-forming coatings are susceptible to Type II hot corrosion. Silica ($SiO_2$)-forming coatings containing a high silicon content have been produced by chemical vapor deposition or pack cementation methods. These coatings are deposited at high substrate temperatures that degrade the mechanical properties of the substrate.

SUMMARY

An aspect of the present disclosure relates to a method of depositing Ni—Cr and Si coatings onto a turbine component. The method includes supplying a Ni—Cr target and Si target with a dual-gun magnetron sputtering system, introducing inert gas and negatively biasing the magnet assembly, and grounding or negatively biasing a turbine component to be coated. The method also includes rotating the turbine component, wherein the turbine component has a surface and forming a Ni—Cr and Si coating on the turbine component surface.

In one aspect of the above, a method of deposition of Ni—Cr and Si coatings onto a turbine component is provided that includes supplying a Ni—Cr target and Si target with a dual-gun magnetron sputtering system, introducing inert gas and negatively biasing the magnet assembly and grounding or negatively biasing the turbine component to be coated. This may then be followed by rotating the turbine component wherein said turbine component has a surface and forming a multilayered Ni—Cr and Si coating on the component surface.

In another aspect of the above, a method of deposition of a Ni—Cr—Si coatings onto a turbine component is provided that includes supplying a Ni—Cr—Si target with a magnetron sputtering system, introducing inert gas and negatively biasing the magnet assembly and grounding or negatively biasing the turbine component to be coated. This may then be followed by rotating the turbine component, wherein the turbine component has a surface and forming a coating including Ni—Cr—Si in a single layer on the component surface.

BRIEF DESCRIPTION OF THE DRAWINGS

The detailed description below may be better understood with reference to the accompanying figures which provide for illustrative purposes and are not considered as limiting any aspect of the invention.

DETAILED DESCRIPTION OF PREFERRED EMBODIMENTS

The present disclosure is directed at depositing nickel-chromium-silicon (Ni—Cr—Si) coatings onto metallic substrates. The metallic substrates may preferably include turbine components, and in particular, superalloy gas turbine components. A turbine component may be understood as any metallic substrate that may be employed in a turbine engine, such as impellers, blades, jet pipes, tail cones, main shafts, combustion chambers, etc.

As noted above, a superalloy is reference herein to an alloy that may employ a base alloying element of nickel, cobalt, nickel-cobalt or nickel-iron and which may typically have a matrix with an austenitic face-centered cubic crystal structure. Some examples of superalloys include those sold under the names HASTELLOY™, INCONEL™, WASPALOY™, HAYNES™ alloys, and INCOLOY™.

HASTELLOY compositions include, for example, Co present in the range of 0.2 at % to 3 at %, Cr present in the range of 1 at % to 20 at %, Mo present in the range of 5.5 at % to 28.5 at %, W optionally present in the range of 0.5 to 4 at %, Fe present in the range of 1.5 to 18.5 at %, Si present in the range of 0.08 to 1 at %, Mn optionally present in the range of 0.5 to 3 at %, C present in the range of 0.01 to 0.12 at %, wherein the balance is Ni. Other optional elements that may be present in HASTELLOY compositions include one or more of the following: Al up to 0.5 at %, Ti up to 0.7 at %, Cu up to 2 at %, V up to 0.6 at %, Nb up to 0.8 at %.

INCOLOY compositions include, for example, 18 to 20 at % Cr, Ti optionally present up to 0.2 at %, C optionally up to 0.1 at %, Cu present up to 3.5 at %, Mn present up to 2.0 atomic percent, Co optionally present up to 18 at %, Ni present up to 35 at %, P optionally present up to 0.045 at %, Si present up to 2.3 at %, S present up to 0.035 at %, Mo optionally present up to 2.5 at %, and Nb and Ti optionally present up to 1.0 at % combined, the balance being Fe.

ICONEL compositions include, for example, Ni present in the range of 44.2 to 72.0 at %, Cr present in the range of 14 to 23 at %, Fe present in the range of 2 to 23 at %, Mo optionally present from 2.8 to 10 at %, Nb optionally present from 0.7 to 5.5 at %, Co optionally present from 1.0 to 15 at %, Mn present from 0.35 to 1.0 at %, Cu optionally present from 0.2 to 0.8 at %, Al optionally present from 0.4 to 1.5 at %, Ti optionally present from 0.3 to 2.75 at %, Si present from 0.35 to 0.5 at %, C present from 0.08 to 0.15 at %, S present from 0.01 to 0.015 at %, P optionally present at 0.015 at %, and B optionally present at 0.006 at %.

WASPALOY may include the following composition: 58 at % Ni, 19 at % Cr, 13 at % Co, 4 at % Mo, 3 at % Ti, and 1.4 at % Al. In the above compositions, at % is the atomic percent of the total alloy composition and the alloy formulations are present at 100 at %. Furthermore, specific formulations may be selected from the above as known by those of ordinary skill in the art.

Figure 1:
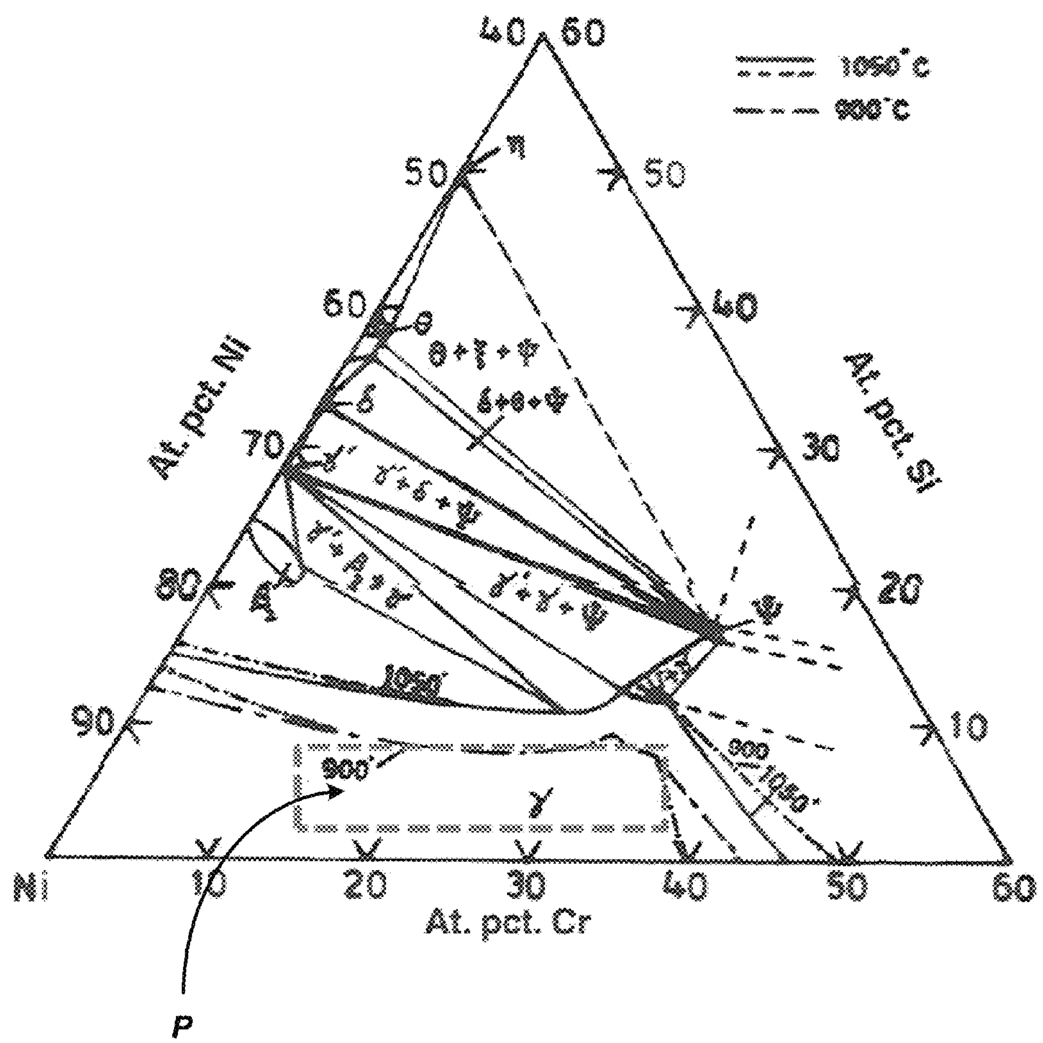
FIG. 1 illustrates a partial isothermal phase diagram of the Cr—N—Si system at 900° C. and 1050° C.

Preferably, the Ni—Cr—Si coating amounts to a coating composition that is within the identified single phase field of the Ni—Cr—Si ternary phase diagram that appears in FIG. 1. More specifically, the Ni—Cr—Si system herein is within the single, face-centered-cubic gamma phase “P” of this diagram. The coating composition therefore preferably contains, includes, or consists of, 15-40 atomic percent Cr, 4-9 atomic percent Si, and the balance comprises Ni. In embodiments, Cr is present at one or more of the following values or range of values selected therefrom: 15 at %, 16 at %, 17 at %, 18 at %, 19 at %, 20 at %, 21 at %, 22 at %, 23 at %, 24 at %, 25 at %, 26 at %, 27 at %, 28 at %, 29 at %, 30 at %, 31 at %, 32 at %, 33 at %, 34 at %, 35 at %, 36 at %, 37 at %, 38 at %, 39 at %, and 40 at %, wherein at % an atomic percent of the total formulation. Si is present at one or more of the following values or range of values selected therefrom: 4 at %, 5 at %, 6 at %, 7 at %, 8 at %, and 9 at %, wherein at % an atomic percent of the total formulation. Ni is present at one or more of the following values or range of values selected therefrom: 51 at %, 52 at %, 53 at %, 54 at %, 55 at %, 56 at %, 57 at %, 58 at %, 59 at %, 60 at %, 61 at %, 62 at %, 63 at %, 64 at %, 65 at %, 66 at %, 67 at %, 68 at %, 69 at %, 70 at %, 71 at %, 72 at %, 73 at %, 74 at %, 75 at %, 76 at %, 77 at %, 78 at %, 79 at %, 80 at %, and 81 at %. Some impurities may be present up to 1.0 at % of the total formulation.

Alternatively, as deposited, the coating includes the above formulations present between multiple layers. Stated another way, alternating layers of Ni—Cr and Si are formed, wherein the coating overall exhibits the above recited compositions and contains, includes, or consists of, 15-40 atomic percent Cr, 4-9 atomic percent Si, and the balance comprises Ni. In further embodiments, the coatings include layers including Ni—C—Si in the above recited formulations as well as individual layers of Ni—Cr and Si, such that the total formulation composition is as described above, wherein the coating includes or consists of 15-40 atomic percent Cr, 4-9 atomic percent Si, and the balance comprises Ni. After heat treatment, the coating composition may homogenize due to diffusion of Si into the Ni—Cr layers. The coating deposited by the magnetron sputter method has a relatively fine grain structure. Si can diffuse into the Ni—Cr alloy matrix as a solid solution. At relatively high temperature and sufficient time, the boundary between the Ni—C and Si will disappear as the results of Ni—Ci, Si interdiffusion.

Preferably, the Ni—Cr—Si coatings may be produced by a dual gun, relatively high power pulsed magnetron sputtering (HPPMS) process utilizing inert gas (e.g. Ar). The HPPMS technique may be understood as generating a relatively high degree of ionization of the sputter species to achieve a relatively high plasma density (e.g. up to 10 kW/cm$^2$) preferably utilizing a pulsed, relatively high peak target power density for a relatively short period of time. High power densities, on the order of at least 0.1 kW/cm$^2$ and up to 10 kW/may be used in pulses of tens of microseconds (e.g., 10-100) at relatively low duty cycles (on/off time ratio) of less than 10%, such as 9%, 8%, 7%, 6%, 5%, 4%, 3%, 2%, 1%, etc.

Figure 2:
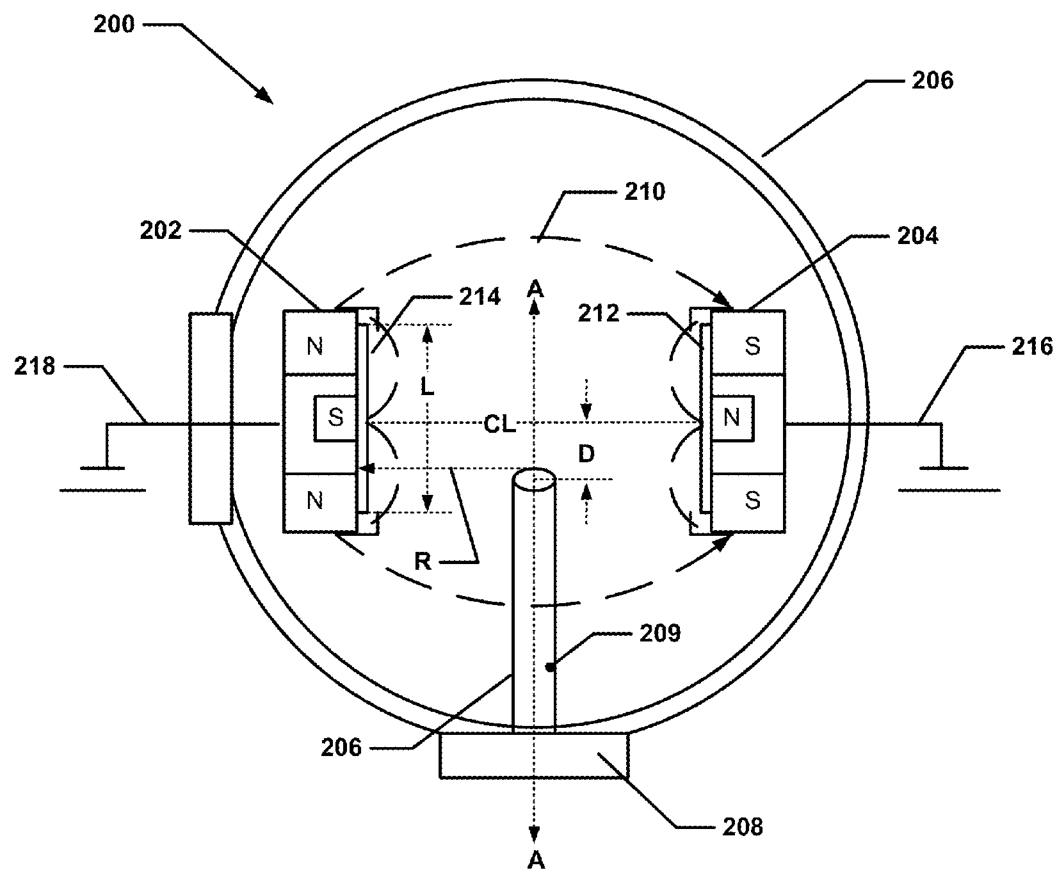
FIG. 2 illustrates a preferred dual-gun high powered pulsed magnetron sputtering apparatus.

FIG. 2 shows a schematic diagram of a preferred system set-up for a dual-gun HPPMS for deposition of a Ni—Cr—Si coating. As can be seen, the coating deposition system preferably includes two magnetrons 202, 204 (Magnetron I and Magnetron II) facing one another and arranged in a vacuum chamber 206. Up to four magnetrons are contemplated. Magnetron I 202 preferably utilizes a Ni—Cr target and Magnetron II 204 preferably utilizes a Si target. While Magnetron I is illustrated on the left and Magnetron II is illustrated on the right, the positioning of the targets may be reversed. Reference to such magnetrons is reference to the use of a magnetic field during the sputtering process to draw secondary electrons relatively close to the target. This may then enhance ionization of the plasma proximate the target leading to a higher relatively sputtering rate. Sputter deposition may then occur by feeding inert gas (e.g. Ar) and negatively biasing the magnetic assembly and grounding or negatively biasing the preferred Ni-based superalloy component to be coated. In embodiments, the magnetrons are unbalanced, have opposing magnetic polarities, and are coupled such that a magnetic field 210 develops as between the two magnetrons 202, 204, forming a closed magnetic field and extending the plasma and electrons further away from the target 212, 214.

In embodiments, the magnetrons are separated by a distance of 2R and the substrate 206 including a surface 209 is positioned on a worktable 208, between the magnetrons, and away from each magnetron by a distance of R+/−10% of the total distance between the two magnetrons, measured from a center axis A-A of the substrate 206 and the unexposed surface (or back surface) of the target 212, 214 including all values and increments therein, such as 5% or less, 3% or less, etc. or in the center. In addition, in embodiments, the substrate is positioned away from the center line CL of the targets by a distance D, wherein distance D is 1% to 50% of the total length of the target L. By adjusting the individual magnetron power and rotating speed of the substrate to be coated around its axis (such as axis A-A), different Ni—Cr—Si coating compositions may be produced. Superalloy coupons or gas turbine blades may be positioned on specimen holders on a rotating shaft so that the coupons or gas turbine blades may be coated on all surfaces with elements emitted from both magnetrons. Each magnetron 202, 204 is connected to a power generator, such as a modulated pulse power generator, via a conductive path way 216, 218.

The HPPMS process is preferably configured as a relatively low temperature physical vapor deposition process. The substrate temperature during coating deposition is preferably at or less than 300° C. For example, the substrate temperature during coating may be in the range of 25° C. to 300° C., including all values and ranges therein and preferably less than 100° C. By operating at such temperatures, the mechanical properties of the substrate as well as the coating may not be adversely affected. Within the coating structure, the Ni—Cr layer may provide a relatively ductile coating matrix. The % elongation (a measure of ductility) is expect to be 40-50% similar to that of the ductile engineering alloy Ni-20 wt. % Cr. Such Ni—Cr layer may preferably be at a thickness of 8-12 nm. The Si layer may then serve as the reservoir for protective silica scale formation. Silica scale formation may be understood as reference to the deposition of colloidal silica and silicate based salt formation. The Si layer may preferably be present at a thickness of 1-2 nm. As previously noted, the preferred coating composition may comprise the single phase (face-centered-cubic gamma phase) as illustrated in FIG. 1 at 15-40 atomic percent Cr, 4-9 atomic percent Si, and the balance containing Ni.

Figure 3:
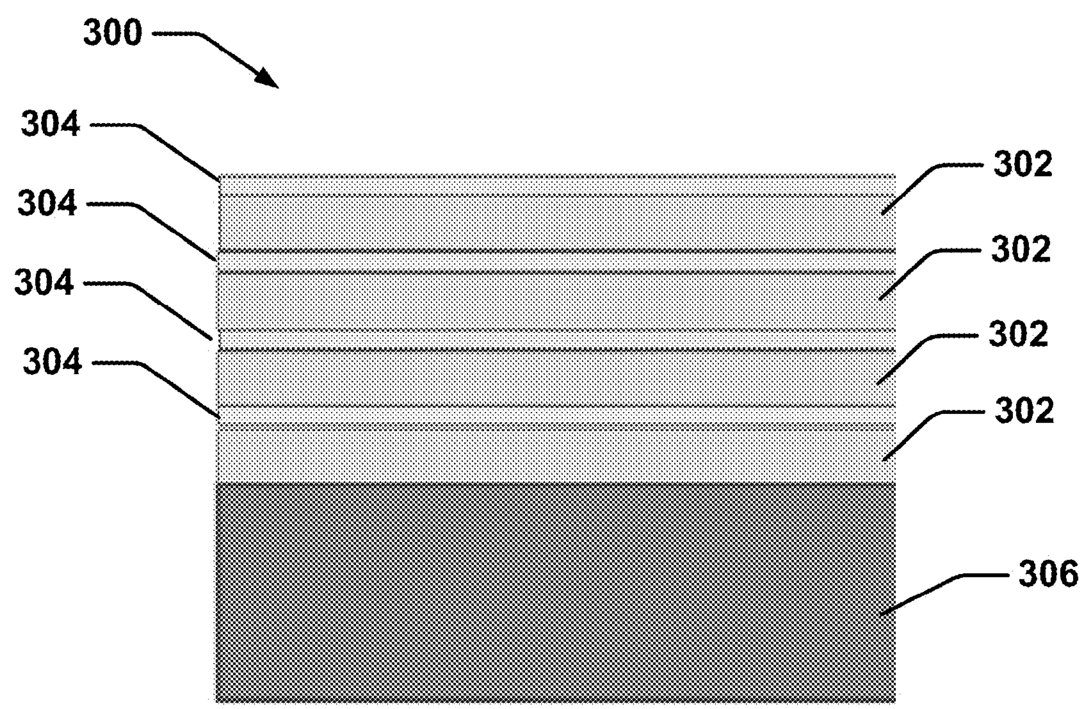
FIG. 3 illustrates one preferred Ni—Cr and Si multilayered coating structure.

FIG. 3 shows one preferred Ni—Cr, Si multilayered coating structure 300 including layers of Ni—Cr 302 and Si 304 deposited on a substrate 306. After coating deposition, the coated structures are heat-treated for at least 30 minutes and up to 96 hours, including all values and ranges therein, in an inert (e.g., Ar) atmosphere at a temperature of at least 900° C. and up to 1100° C., including all values and ranges therein. The heat treatment process homogenizes the coating composition and forms an initial silica scale on the coating surface. That is the composition become more uniform throughout the coating layers. After exposure to temperatures at 600° C.-950° C., a protective silica scale may be continuously-grown and formed to separate any sulfate salt deposits (from the above referenced hot corrosion) from the underlying Ni—Cr, Si multilayered coating and the substrate. It should be noted the diffusion between the Ni—Cr and Si layers may occur after exposure.

Figure 4:
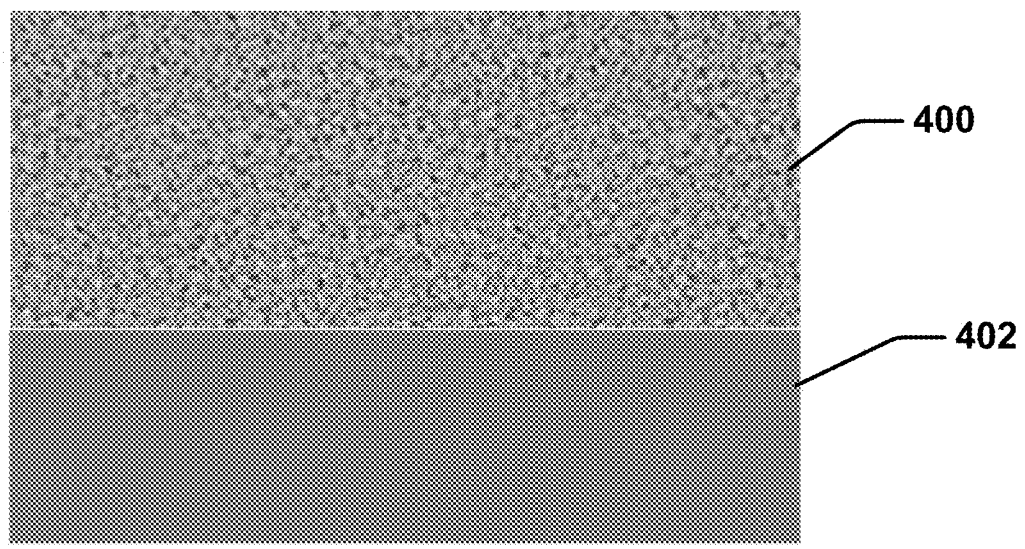
FIG. 4 illustrates another preferred Ni—Cr—Si single layered coating structure.

FIG. 4 shows another preferred Ni—Cr—Si single-layered coating structure 400 deposited on a substrate 402. The coating compositions include those set forth above and similar to the coatings above, a protective silica scale may be thermally-grown and formed on the coating surface when exposured to high temperatures, such as those in the range of 600° C. to 950° C.

Figure 5:
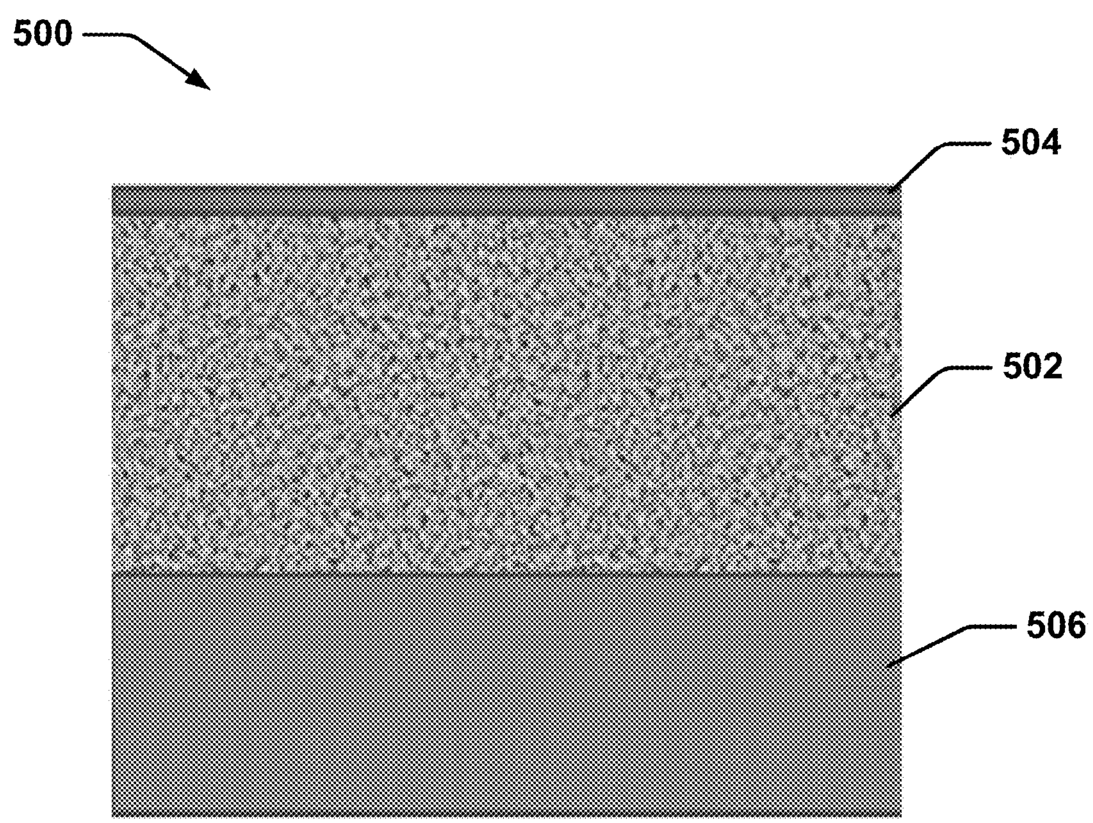
FIG. 5 illustrates the formation of a layer of $SiO_2$ and the presence of a Ni—Cr—Si layer on the identified substrate.

As shown in FIG. 5, the formed $SiO_2$ layer 504 and the Ni—Cr—Si layer 502 coating 500, produced according to any of the embodiments above, may act as the barrier to protect the substrate 506 and when applied to a superalloy gas turbine substrate, extend the turbine's useful operational life. The overall coating thickness may be 200 μm of less, such as in the range of 20 μm to 200 μm including all values and ranges therein and preferably 20 μm to 125 μm, and more preferably 20 μm to 100 μm, 100 μm, 50 μm, 20 μm, etc.

Figure 6:
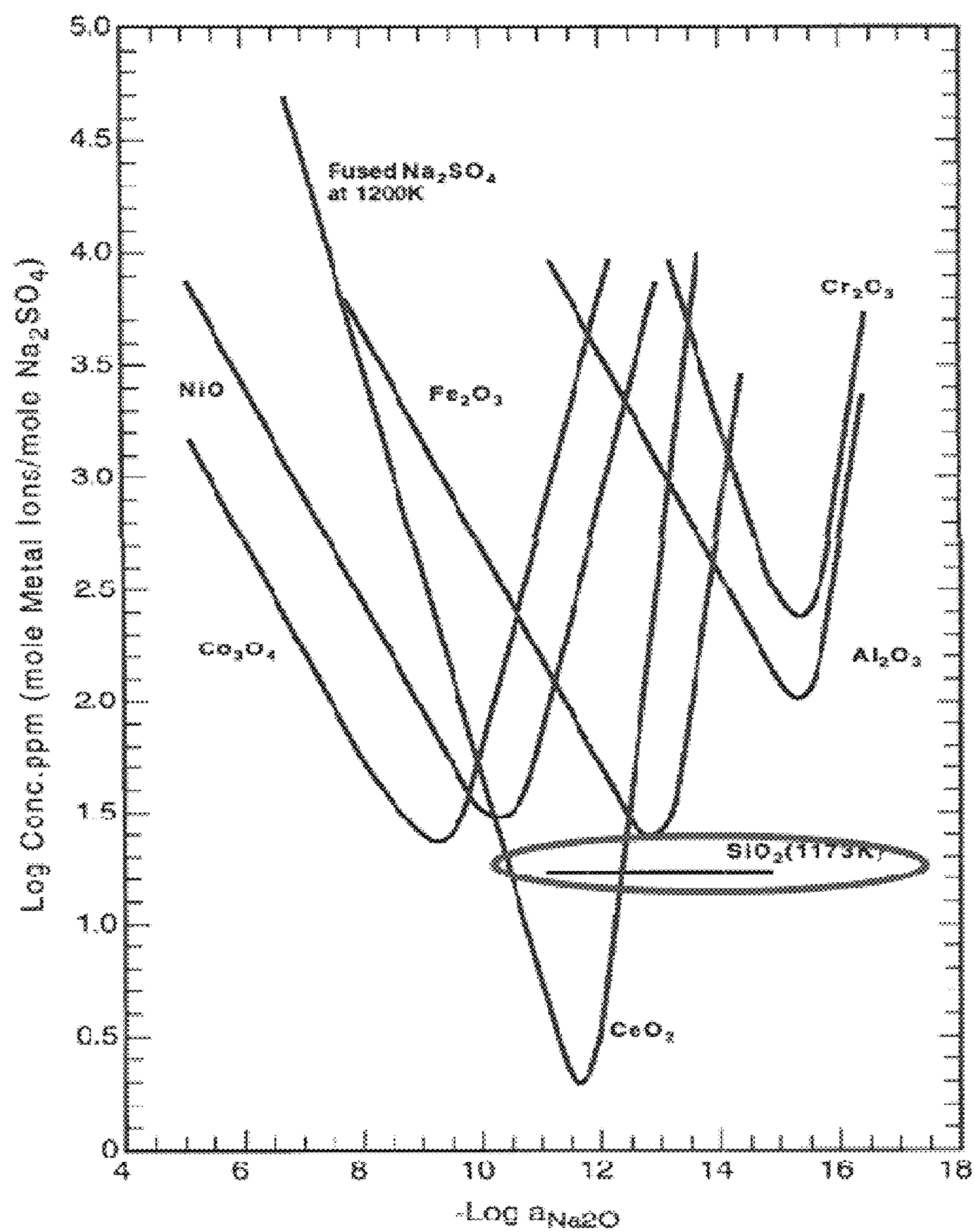
FIG. 6 shows a report on the measured solubility parameters of the indicated oxides in $Na_2SO_4$ at 927° C.

Attention is next directed to FIG. 6 which identifies the reported and measured solubility of the indicated oxides in $Na_2SO_4$ at 927° C. See, R. A. Rapp "Hot Corrosion Of Materials: A Fluxing Mechanism?", Corrosion Science, Vol. 44, 209-221 (2002). As can be seen, the $SiO_2$ forms no soluble species with $Na_2SO_4$ at 900° C. Hence, the relative effectiveness of the formation of $SiO_2$ layer at the coating surface for protecting the underlying turbine substrates.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A method of depositing coatings onto a turbine component comprising: supplying a Ni—Cr target and Si target with a dual-gun magnetron sputtering system; introducing inert gas and negatively biasing the magnet assembly; grounding or negatively biasing a turbine component to be coated, wherein said turbine component has a surface; maintaining a temperature of said turbine component not higher than 100° C. during coating; applying a power density of at least 0.1 kW/cm2 in pulses of microseconds in the range of 10 to 100 microseconds and at duty cycles of less than 10% to each of said targets; and forming a coating consisting of: (i) a Ni—Cr and Si coating on said turbine component surface; or (ii) a Ni—Cr—Si coating in a single layer on said turbine surface, and exposing said coating to a temperature in the range of 600° C. to 950° C. and forming a silica scale on said coating.

2. The method of claim 1, wherein said coating comprises a Ni—Cr layer and a Si layer on said surface.

3. The method of claim 1 wherein said coating comprises Cr at 15-40 atomic percent, Si at 4-9 atomic percent, the balance comprising Ni.

4. The method of claim 2 wherein said Ni—Cr layer has a thickness of 8-12 nm and said Si layer has a thickness of 1-2 nm.

5. The method of claim 1 wherein said turbine component comprises a gas turbine component whose base alloying element comprises nickel, cobalt, nickel-cobalt, or nickel-iron.

6. The method of claim 1 wherein said power density is in the range of 0.1 $kW/cm^2$ to 10 $kW/cm^2$.

7. The method of claim 1, wherein said dual-gun magnetron system includes at least two magnetrons and forming a closed magnetic field between said magnetrons.

8. The method of claim 1 wherein said turbine component comprises an alloy containing nickel, cobalt, nickel-cobalt, or nickel-iron.

9. The method of claim 1, wherein said coating exhibits a thickness of 200 μm or less.

10. The method of claim 1, wherein said power density applied to each of said targets is different.

11. A method of depositing coatings onto a turbine component comprising: supplying a Ni—Cr target and Si target with a dual-gun magnetron sputtering system; introducing inert gas and negatively biasing the magnet assembly; grounding or negatively biasing a turbine component to be coated, wherein said turbine component has a surface; maintaining a temperature of said turbine component not higher than 100° C. during coating; applying a power density of at least 0.1 kW/cm2 in pulses of microseconds in the range of 10 to 100 microseconds at duty cycles of less than 10% to each of said targets and forming a coating consisting of: (i) a Ni—Cr and Si coating on said turbine component surface wherein said coating has a thickness of 200 pm or less; or (ii) a Ni—Cr—Si coating in a single layer on said turbine surface, said coating has a thickness of 200 pm or less; and exposing said coating to a temperature in the range of 600° C. to 950° C. and forming a silica scale on said coating.

12. The method of claim 11, wherein said coating comprises a Ni—Cr layer and a Si layer on said surface.

13. The method of claim 11, wherein said coating composition comprises Cr at 15-40 atomic percent, Si at 4-9 atomic percent, the balance comprising Ni.

14. The method of claim 11 wherein said turbine component comprises a gas turbine component whose base alloying element comprises nickel, cobalt, nickel-cobalt, or nickel-iron.

15. The method of claim 11 wherein said power density is in the range of 0.1 $kW/cm^2$ to 10 $kW/cm^2$.

16. The method of claim 11, wherein said power density applied to each of said targets is different.

* * * * *